US012689389B2

(12) United States Patent
Kim et al.

(10) Patent No.: US 12,689,389 B2
(45) Date of Patent: Jul. 21, 2026

(54) SYSTEMS AND METHODS FOR COMPRESSION OF ARTIFICIAL INTELLIGENCE

(71) Applicant: Samsung Electronics Co., Ltd., Suwon-si (KR)

(72) Inventors: Jonghyeon Kim, San Jose, CA (US); Soogil Jeong, Pleasanton, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 108 days.

(21) Appl. No.: 18/440,948

(22) Filed: Feb. 13, 2024

(65) Prior Publication Data

US 2025/0192803 A1     Jun. 12, 2025

Related U.S. Application Data

(60) Provisional application No. 63/608,820, filed on Dec. 11, 2023.

(51) Int. Cl.
H03M 7/00 (2006.01)
H03M 7/30 (2006.01)

(52) U.S. Cl.
CPC .................................. H03M 7/702 (2013.01)

(58) Field of Classification Search
CPC ...... H03M 7/702; H03M 7/30; H03M 7/6094; H03M 7/6064; G06N 3/0495; G06N 3/063
USPC ...................................................... 341/50, 51
See application file for complete search history.

(56) References Cited

U.S. PATENT DOCUMENTS

| | | | | |
|---|---|---|---|---|
| 6,819,271 B2 * | 11/2004 | Geiger | ................. | H04N 19/436 |
| | | | | 341/51 |
| 7,190,284 B1 * | 3/2007 | Dye | ...................... | G06F 12/023 |
| | | | | 711/170 |
| 9,965,210 B2 * | 5/2018 | Alves | ..................... | G06F 3/0638 |
| 10,103,747 B1 * | 10/2018 | Pasha.B.K. | ............. | H03M 7/30 |
| 11,632,129 B2 | 4/2023 | Kim et al. | | |

(Continued)

FOREIGN PATENT DOCUMENTS

| | | | | |
|---|---|---|---|---|
| KR | 102432851 B1 | 8/2022 | | |
| WO | WO2020244215 | * 12/2020 | ........... | G06F 16/904 |

OTHER PUBLICATIONS

Go, Mijin et al., "Linearization Weight Compression and In-Situ Hardware-Based Decompression for Attention-Based Neural Machine Translation," IEEE Access (vol. 11), May 2023, pp. 42751-42763.

(Continued)

*Primary Examiner* — Jean B Jeanglaude

(74) *Attorney, Agent, or Firm* — Renaissance IP Law Group LLP

(57) ABSTRACT

Provided are systems, methods, and apparatuses for compression of artificial intelligence models. In one or more examples, the systems, devices, and methods include categorizing data based on an analysis of a distribution of the data, generating compressed data based on the data and on a compression algorithm that is selected based on the categorization, and storing the compressed data in a storage device. In one or more examples, the systems, devices, and methods include identifying an address associated with compressed data based on a request for the compressed data, determining a decompression algorithm based on the address, and decompressing the compressed data using the determined decompression algorithm.

18 Claims, 8 Drawing Sheets

(56) References Cited

U.S. PATENT DOCUMENTS

| 2004/0250009 | A1 | | 12/2004 | Chen et al. | |
| 2015/0220448 | A1 | * | 8/2015 | Chen | G06F 9/35 |
| | | | | | 711/217 |
| 2017/0187388 | A1 | * | 6/2017 | Satpathy | H03M 7/6017 |
| 2019/0190538 | A1 | * | 6/2019 | Park | G06N 3/063 |
| 2020/0264778 | A1 | | 8/2020 | Yang et al. | |
| 2020/0372320 | A1 | * | 11/2020 | Lin | H03M 7/3077 |
| 2022/0067527 | A1 | | 3/2022 | Xu et al. | |
| 2022/0180180 | A1 | | 6/2022 | Liu et al. | |
| 2022/0376703 | A1 | * | 11/2022 | Pope | H03M 7/70 |

OTHER PUBLICATIONS

European Extended Search Report for Application No. 24216778.1, mailed May 8, 2025.

\* cited by examiner

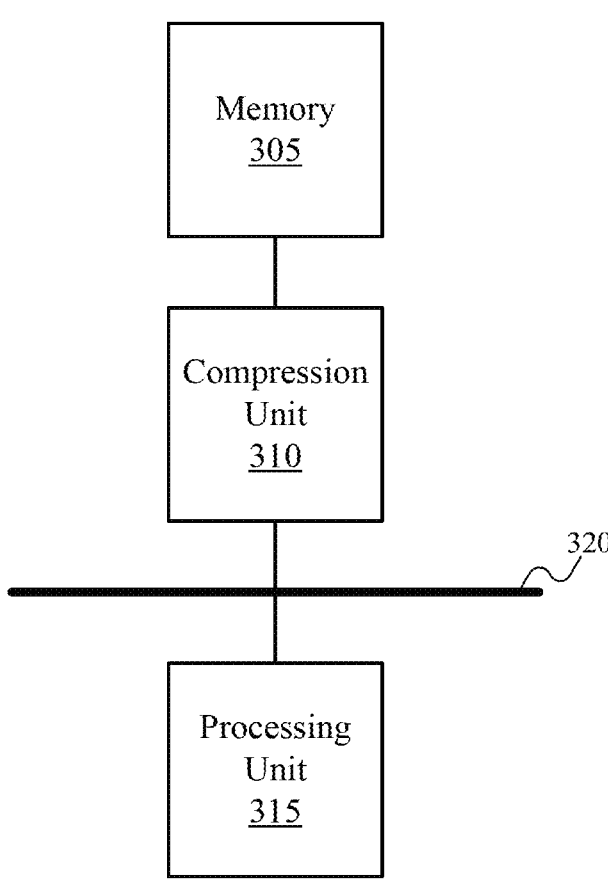
FIG. 3

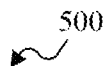
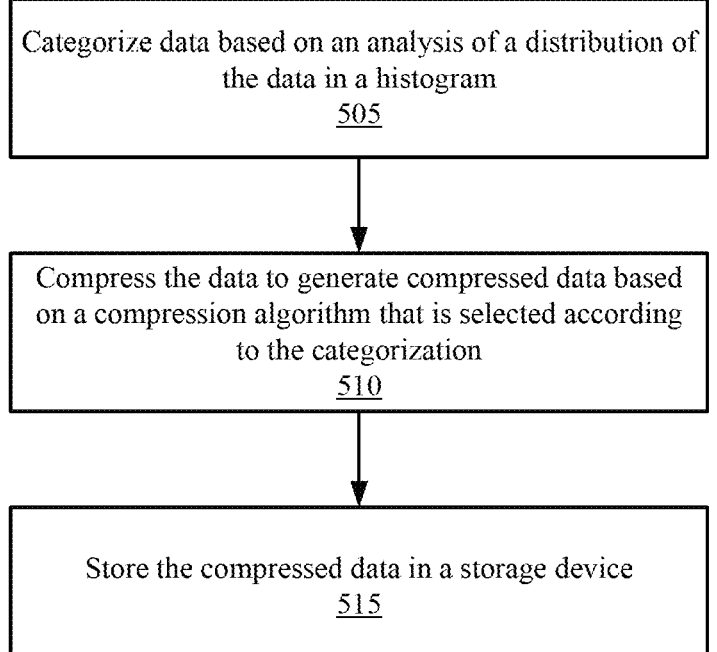
Categorize data based on an analysis of a distribution of the data in a histogram
505
Compress the data to generate compressed data based on a compression algorithm that is selected according to the categorization
510
Store the compressed data in a storage device
515
FIG. 5

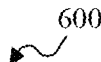
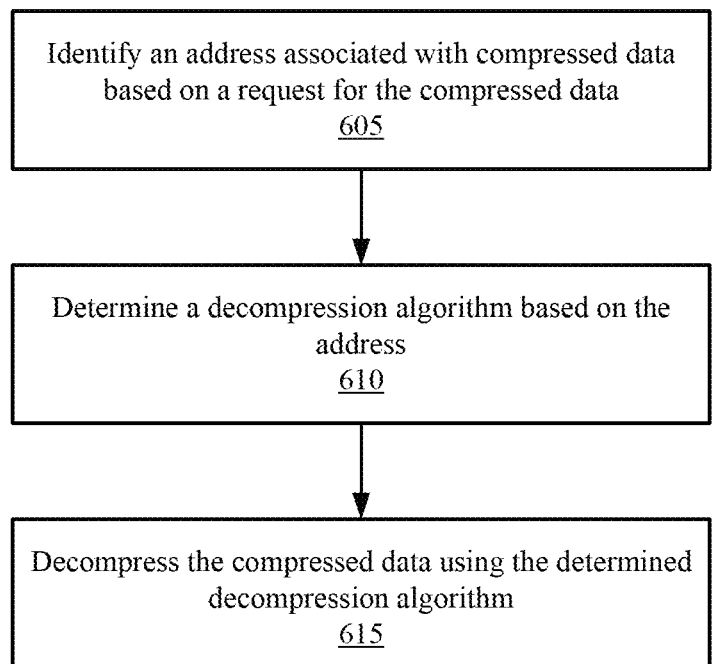
Identify an address associated with compressed data based on a request for the compressed data
605
Determine a decompression algorithm based on the address
610
Decompress the compressed data using the determined decompression algorithm
615
FIG. 6

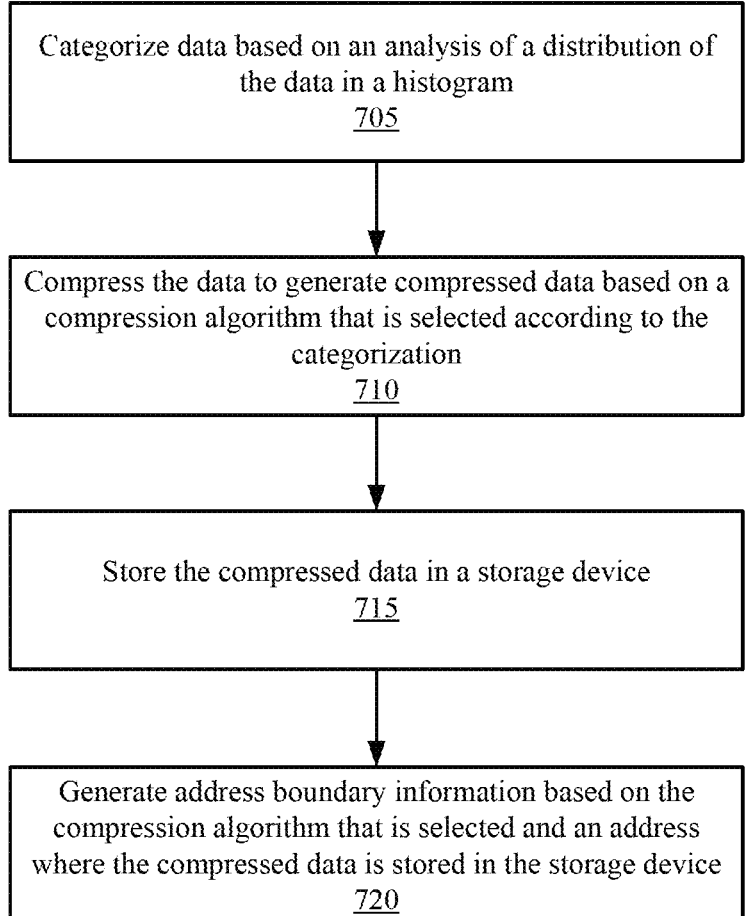

Categorize data based on an analysis of a distribution of the data in a histogram
705

Compress the data to generate compressed data based on a compression algorithm that is selected according to the categorization
710

Store the compressed data in a storage device
715

Generate address boundary information based on the compression algorithm that is selected and an address where the compressed data is stored in the storage device
720

FIG. 7

SYSTEMS AND METHODS FOR COMPRESSION OF ARTIFICIAL INTELLIGENCE

CROSS-REFERENCE TO RELATED APPLICATION

This application claims the benefit of U.S. Provisional Patent Application Ser. No. 63/608,820, filed Dec. 11, 2023, which is incorporated by reference herein for all purposes.

TECHNICAL FIELD

The disclosure relates generally to memory systems, and more particularly to systems and methods for compression of artificial intelligence models.

BACKGROUND

The present background section is intended to provide context only, and the disclosure of any concept in this section does not constitute an admission that said concept is prior art.

Artificial intelligence (AI) workloads demand storage solutions that provide high throughput and low latency to accommodate rapid processing of relatively large datasets. High throughput ensures data can be read and written swiftly. Low latency guarantees quick data access, which is essential for real-time AI applications. However, the proliferation of AI has resulted in a rapid increase in demands for improvements in data movement bandwidths and data storage capacity, which has left data centers and related devices struggling to keep up with demand.

The above information disclosed in this Background section is only for enhancement of understanding of the background of the disclosure and therefore it may contain information that does not constitute prior art.

SUMMARY

In various embodiments, described herein include systems, methods, and apparatuses for systems and methods for compression of artificial intelligence models. In some aspects, the techniques described herein relate to a method including: categorizing data based on an analysis of a distribution of the data; generating compressed data based on the data and on a compression algorithm that is selected based on the categorization; and storing the compressed data in a storage device.

In some aspects, the techniques described herein relate to a method, further including generating address boundary information based on the compression algorithm that is selected.

In some aspects, the techniques described herein relate to a method, further including storing a mapping between the address boundary information and the compression algorithm.

In some aspects, the techniques described herein relate to a method, wherein the address boundary information is based on an address where the compressed data is stored in the storage device.

In some aspects, the techniques described herein relate to a method, further including generating a histogram based on the data.

In some aspects, the techniques described herein relate to a method, wherein the data includes weights of an artificial intelligence model, and further including generating the histogram based on the weights of the artificial intelligence model.

In some aspects, the techniques described herein relate to a method, wherein the distribution of the data is based on the histogram.

In some aspects, the techniques described herein relate to a method, wherein the storage device includes a solid-state drive, and at least a portion of the compression is performed by a processing unit communicatively connected to the storage device.

In some aspects, the techniques described herein relate to a method including: identifying an address associated with compressed data based on a request for the compressed data; determining a decompression algorithm based on the address; and decompressing the compressed data using the determined decompression algorithm.

In some aspects, the techniques described herein relate to a method, wherein identifying the decompression algorithm is based on comparing the address of the compressed data to a boundary address associated with the decompression algorithm and identifying a match based on the comparing.

In some aspects, the techniques described herein relate to a method, wherein the boundary address is based on an address range of where the compressed data is stored in a storage device.

In some aspects, the techniques described herein relate to a method, wherein the storage device includes a solid-state drive.

In some aspects, the techniques described herein relate to a method, wherein the storage device includes a mapping between the boundary address and the decompression algorithm.

In some aspects, the techniques described herein relate to a method, wherein the compressed data includes weights of an artificial intelligence model.

In some aspects, the techniques described herein relate to a device, including: at least one processing unit to categorize data based on an analysis of a distribution of the data in a histogram; a compressor to compress the data to generate compressed data based on a compression algorithm that is selected by the at least one processing unit based on the categorization; and a storage device to store the compressed data.

In some aspects, the techniques described herein relate to a device, wherein the at least one processing unit is configured to generate address boundary information based on the compression algorithm that is selected.

In some aspects, the techniques described herein relate to a device, wherein the storage device is configured to store a mapping between the address boundary information and the compression algorithm.

In some aspects, the techniques described herein relate to a device, including: at least one processing unit to: identify an address associated with compressed data based on a request for the compressed data; and determine a decompression algorithm based on the address; and a decompressor to decompress the compressed data using the determined decompression algorithm.

In some aspects, the techniques described herein relate to a device, wherein, to identify the decompression algorithm, the at least one processing unit is configured to: compare the address of the compressed data to a boundary address associated with the decompression algorithm; and identify a match based on the comparison.

In some aspects, the techniques described herein relate to a device, wherein the boundary address is based on an address range of where the compressed data is stored in a storage device.

In some aspects, the techniques described herein relate to a device, wherein the storage device includes a solid-state drive.

In some aspects, the techniques described herein relate to a device, wherein the storage device stores a mapping between the boundary address and the decompression algorithm.

In some aspects, the techniques described herein relate to a device, wherein the decompression algorithm corresponds to a distribution of data that includes weights of an artificial intelligence model, and the compressed data includes the weights of the artificial intelligence model.

A computer-readable medium is disclosed. The computer-readable medium can store instructions that, when executed by a computer, cause the computer to perform substantially the same or similar operations as described herein are further disclosed. Similarly, non-transitory computer-readable media, devices, and systems for performing substantially the same or similar operations as described herein are further disclosed.

Accordingly, the techniques described herein include multiple advantages and benefits. For example, the compression logic and methodology provide a higher lossless compression ratio compared to some approaches. Also, the compression logic and methodology can be applied to a portion of an AI model or can be applied to all of an AI model. The compression achieved from the compression logic and methodology described herein is significantly higher than the compression of other approaches (e.g., greater than 22% compression ratio compared to 10% or less compression ratios of other approaches). Accordingly, the compression logic and methodology described herein improve compression rates, improve system efficiency, improve AI inference performance and AI training performance, all while lowering associated costs.

BRIEF DESCRIPTION OF THE DRAWINGS

The above-mentioned aspects and other aspects of the present techniques will be better understood when the present application is read in view of the following figures in which like numbers indicate similar or identical elements. Further, the drawings provided herein are for purpose of illustrating certain embodiments only; other embodiments, which may not be explicitly illustrated, are not excluded from the scope of this disclosure.

These and other features and advantages of the present disclosure will be appreciated and understood with reference to the specification, claims, and appended drawings wherein:

FIG. 3 illustrates an example system in accordance with one or more implementations as described herein.

FIG. 5 depicts a flow diagram illustrating an example method associated with the disclosed systems, in accordance with example implementations described herein.

FIG. 6 depicts a flow diagram illustrating an example method associated with the disclosed systems, in accordance with example implementations described herein.

FIG. 7 depicts a flow diagram illustrating an example method associated with the disclosed systems, in accordance with example implementations described herein.

Figure 1:
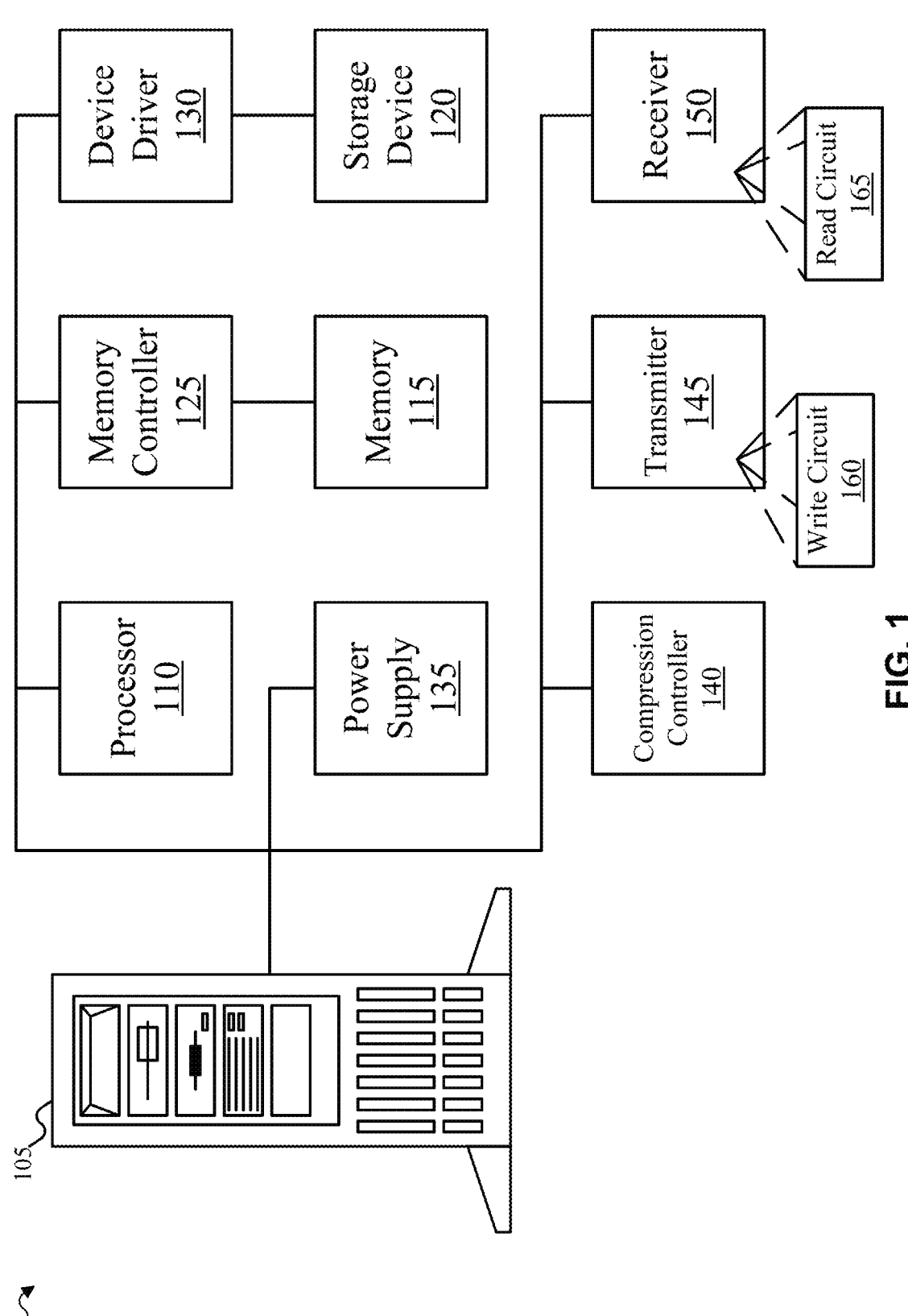
FIG. 1 illustrates an example system in accordance with one or more implementations as described herein.

While the present techniques are susceptible to various modifications and alternative forms, specific embodiments thereof are shown by way of example in the drawings and will herein be described. The drawings may not be to scale. It should be understood, however, that the drawings and detailed description thereto are not intended to limit the present techniques to the particular form disclosed, but to the contrary, the intention is to cover all modifications, equivalents, and alternatives falling within the spirit and scope of the present techniques as defined by the appended claims.

DETAILED DESCRIPTION OF VARIOUS EMBODIMENTS

The details of one or more embodiments of the subject matter described herein are set forth in the accompanying drawings and the description below. Other features, aspects, and advantages of the subject matter will become apparent from the description, the drawings, and the claims.

Various embodiments of the present disclosure now will be described more fully hereinafter with reference to the accompanying drawings, in which some, but not all embodiments are shown. Indeed, the disclosure may be embodied in many different forms and should not be construed as limited to the embodiments set forth herein; rather, these embodiments are provided so that this disclosure will satisfy applicable legal requirements. The term "or" is used herein in both the alternative and conjunctive sense, unless otherwise indicated. The terms "illustrative" and "example" are used to be examples with no indication of quality level. Like numbers refer to like elements throughout. Arrows in each of the figures depict bi-directional data flow and/or bi-directional data flow capabilities. The terms "path," "pathway" and "route" are used interchangeably herein.

Embodiments of the present disclosure may be implemented in various ways, including as computer program products that comprise articles of manufacture. A computer program product may include a non-transitory computer-readable storage medium storing applications, programs, program components, scripts, source code, program code, object code, byte code, compiled code, interpreted code, machine code, executable instructions, and/or the like (also referred to herein as executable instructions, instructions for execution, computer program products, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (for example a solid-state drive (SSD)), solid state card (SSC), solid state module (SSM), enterprise flash drive, magnetic tape, or any other non-transitory magnetic medium, and/or the like. A non-volatile computer-readable storage medium may include a punch card, paper tape, optical mark sheet (or any other physical medium with patterns of holes or other optically recognizable indicia), compact disc read only memory (CD-ROM), compact disc-rewritable (CD-RW), digital versatile disc (DVD), Blu-ray disc (BD), any other non-transitory optical medium, and/or the like. Such a non-volatile computer-readable storage medium may include read-only memory (ROM), programmable read-only memory (PROM), erasable programmable read-only memory (EPROM), electrically erasable programmable read-only memory (EEPROM), flash memory (for example Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may include conductive-bridging random access memory (CBRAM), phase-change random access memory (PRAM), ferroelectric random-access memory (FeRAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory component (RIMM), dual in-line memory component (DIMM), single in-line memory component (SIMM), video random access memory (VRAM), cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present disclosure may be implemented as methods, apparatus, systems, computing devices, computing entities, and/or the like. As such, embodiments of the present disclosure may take the form of an apparatus, system, computing device, computing entity, and/or the like executing instructions stored on a computer-readable storage medium to perform certain steps or operations. Thus, embodiments of the present disclosure may take the form of an entirely hardware embodiment, an entirely computer program product embodiment, and/or an embodiment that comprises combination of computer program products and hardware performing certain steps or operations.

Embodiments of the present disclosure are described below with reference to block diagrams and flowchart illustrations. Thus, it should be understood that each block of the block diagrams and flowchart illustrations may be implemented in the form of a computer program product, an entirely hardware embodiment, a combination of hardware and computer program products, and/or apparatus, systems, computing devices, computing entities, and/or the like carrying out instructions, operations, steps, and similar words used interchangeably (for example the executable instructions, instructions for execution, program code, and/or the like) on a computer-readable storage medium for execution. For example, retrieval, loading, and execution of code may be performed sequentially such that one instruction is retrieved, loaded, and executed at a time. In some example embodiments, retrieval, loading, and/or execution may be performed in parallel such that multiple instructions are retrieved, loaded, and/or executed together. Thus, such embodiments can produce specifically-configured machines performing the steps or operations specified in the block diagrams and flowchart illustrations. Accordingly, the block diagrams and flowchart illustrations support various combinations of embodiments for performing the specified instructions, operations, or steps.

The following description is presented to enable one of ordinary skill in the art to make and use the subject matter disclosed herein and to incorporate it in the context of particular applications. While the following is directed to specific examples, other and further examples may be devised without departing from the basic scope thereof.

Various modifications, as well as a variety of uses in different applications, will be readily apparent to those skilled in the art, and the general principles defined herein may be applied to a wide range of embodiments. Thus, the subject matter disclosed herein is not intended to be limited to the embodiments presented, but is to be accorded the widest scope consistent with the principles and novel features disclosed herein.

In the description provided, numerous specific details are set forth in order to provide a more thorough understanding of the subject matter disclosed herein. It will, however, be apparent to one skilled in the art that the subject matter disclosed herein may be practiced without necessarily being limited to these specific details. In other instances, well-known structures and devices are shown in block diagram form, rather than in detail, in order to avoid obscuring the subject matter disclosed herein.

All the features disclosed in this specification (e.g., any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Various features are described herein with reference to the figures. It should be noted that the figures are only intended to facilitate the description of the features. The various features described are not intended as an exhaustive description of the subject matter disclosed herein or as a limitation on the scope of the subject matter disclosed herein. Additionally, an illustrated example need not have all the aspects or advantages shown. An aspect or an advantage described in conjunction with a particular example is not necessarily limited to that example and can be practiced in any other examples even if not so illustrated, or if not so explicitly described.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

It is noted that, if used, the labels left, right, front, back, top, bottom, forward, reverse, clockwise and counterclockwise have been used for convenience purposes only and are not intended to imply any particular fixed direction. Instead, the labels are used to reflect relative locations and/or directions between various portions of an object.

Any data processing may include data buffering, aligning incoming data from multiple communication lanes, forward error correction ("FEC"), and/or others. For example, data may be first received by an analog front end (AFE), which prepares the incoming for digital processing. The digital portion (e.g., DSPs) of the transceivers may provide skew management, equalization, reflection cancellation, and/or other functions. It is to be appreciated that the process described herein can provide many benefits, including saving both power and cost.

Moreover, the terms "system," "component," "module," "interface," "model," or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Unless explicitly stated otherwise, each numerical value and range may be interpreted as being approximate, as if the word "about" or "approximately" preceded the value of the value or range. Signals and corresponding nodes or ports might be referred to by the same name and are interchangeable for purposes here.

While embodiments may have been described with respect to circuit functions, the embodiments of the subject matter disclosed herein are not limited. Possible implementations may be embodied in a single integrated circuit, a multi-chip module, a single card, system-on-a-chip, or a multi-card circuit pack. As would be apparent to one skilled in the art, the various embodiments might also be implemented as part of a larger system. Such embodiments may be employed in conjunction with, for example, a digital signal processor, microcontroller, field-programmable gate array, application-specific integrated circuit, or general-purpose computer.

As would be apparent to one skilled in the art, various functions of circuit elements may also be implemented as processing blocks in a software program. Such software may be employed in, for example, a digital signal processor, microcontroller, or general-purpose computer. Such software may be embodied in the form of program code embodied in tangible media, such as magnetic recording media, optical recording media, solid-state memory, floppy diskettes, CD-ROMs, hard drives, or any other non-transitory machine-readable storage medium, that when the program code is loaded into and executed by a machine, such as a computer, the machine becomes an apparatus for practicing the subject matter disclosed herein. When implemented on a general-purpose processor, the program code segments combine with the processor to provide a unique device that operates analogously to specific logic circuits. Described embodiments may also be manifest in the form of a bit stream or other sequence of signal values electrically or optically transmitted through a medium, stored magnetic-field variations in a magnetic recording medium, etc., generated using a method and/or an apparatus as described herein.

Data compression is the process of encoding, restructuring, or modifying data to reduce its size. It involves re-encoding information using fewer bits than the original representation. Data compression has multiple benefits.

Compressing data reduces the space that files occupy on a hard drive. This means more images can be stored in a given amount of disk or memory space. Compressing data reduces the time needed to transfer or download data. Compressing data allows a larger number of files to be stored on a given medium. Data compression includes lossy compression and lossless compression. In lossy compression, irrelevant data is identified and removed to reduce the compression size. A lossy compression algorithm permits only an approximate reconstruction of the original file. In lossless compression, data is transformed through encoding, and its size is reduced. Lossless compression reduces bits by identifying and eliminating statistical redundancy.

In an aspect, artificial intelligence (AI) can include the concept of creating intelligent machines that can sense, reason, act, and adapt. Machine learning (ML) can include a subset of AI that helps build AI-driven applications. In some cases, deep learning can include a subset of machine learning that uses artificial neural networks to mimic the learning process of the human brain. Deep learning algorithms use large amounts of data and complex algorithms to train a model. Neural networks are the foundation of deep learning algorithms. In machine learning, AI inference can include using a trained model to make predictions. AI training is typically a first step in a two-part process of machine learning. Inference can be faster than training because inference does not include the model adjusting its parameters based on new data. Inference also uses less processing power than training clusters.

In some respects, a neural processing unit (NPU) can include a specialized processor that executes machine learning algorithms. NPUs are also called AI accelerators or intelligent processing units (IPUs). NPUs improve the inference performance of neural networks. NPUs work similarly to the human brain. They are made up of nerve cells and synapses that transmit and receive signals to and from each other. NPUs use a data-driven parallel computing architecture to process large amounts of multimedia data, like images and videos. NPUs may be used to offload specific workloads, allowing dedicated hardware to focus on more specialized tasks.

In other aspects, a histogram can include a chart that indicates how frequently a value falls into a particular bin, where the height of a bin corresponds to how many data points are in that bin. Histograms can be used to gain insights into data distributions, identify patterns, detect outliers, analyze process outputs, identify process changes, determine differences in outputs of multiple processes, communicate data distribution, etc. A first histogram may be compared with a second histogram to identify similarities and/or differences. Histograms are useful for large data sets and can help detect outliers and gaps in data. They can show the location, spread, and/or skewness of data.

Compression reduces the size of an application or document for storage or transmission. Compressed files are smaller, download faster, and easier to transport. Decompression (e.g., data expansion) restores the document or application to its original size. With regards to storage space, compressing and decompressing data reduces the amount of disk or memory space needed to store data, thus lowering cost and improving efficiency. The greater the compression rate, the greater the cost savings and efficiency. Compressing and decompressing data improves system performance and decreases latency and computational costs associated with data transfer.

Data compression may be lossless (exact) or lossy (inexact). Lossless compression can be reversed to yield the original data, while lossy compression loses detail or introduces slight errors into decompression/data expansion. A device or a component of a device that performs data compression may be referred to as an encoder, and a device or a component of a device that performs the reversal of the process (decompression) may be referred to as a decoder. A device (e.g., hardware device) that performs data compression and decompression (e.g., compression decompression unit) may be referred to as an encoder decoder (endec). Software (e.g., software device, application, computer program, software implemented by a logical circuit) that is configured to encode/decode and/or compress/decompress data (e.g., digital data, data stream, a signal) may be referred to as a codec. An endec may be configured to implement one or more codecs for compression and decompression.

The techniques described herein include compression logic to provide a compression methodology for artificial intelligence models. The compression logic includes any combination of hardware (e.g., at least one memory, at least one processor), logical circuitry, firmware, and/or software to provide a compression methodology for artificial intelligence models.

The compression logic analyzes data (e.g., of an AI model) and classifies the data to one of several groups based on a histogram associated with the data (e.g., weights of an AI model). In some cases, the compression logic analyzes the histogram of an AI model (e.g., an entire AI model) and classifies the AI model to one of several groups based on the histogram result. The compression logic selects a compression type based on the classified group and applies the selected compression type to the AI data (e.g., AI weights) to compress the data. In some examples, the compression logic applies a first compression algorithm type (e.g., Huffman) to a first type of histogram and a second compression algorithm type (e.g., 1 bit coding) to a second type of histogram. Additionally, or alternatively, the compression logic applies a first version of a compression algorithm to a third type of histogram (e.g., a first type of Huffman coding) and applies a second version of the compression algorithm to a fourth type of histogram (e.g., a second type of Huffman coding different from the first type of Huffman coding).

In one or more examples, the compression logic and methodology described herein analyzes AI weights data (e.g., a histogram of AI weights data, LLM weights data, a histogram of LLM weights data). The compression logic selects a compression type based on the results of the analysis and applies the selected compression algorithm to compress the data. The compression algorithm may be selected from a group of compression algorithms that includes at least one of Huffman, 1 bit coding, Brotli, wavelet compression, run-length encoding, discrete cosine transform, Cartesian perceptual compression, etc., and/or various versions of at least one thereof such as various versions of a Huffman algorithm, etc.

A memory range is a collection of addresses, often shortened to a starting address and the length of the data. The address range of RAM is determined by the number of address lines on the memory bus. For example, a 32-bit system would have a RAM address range of 0 to $2^{32}$ (e.g., 0 to 4,294,967,295 bytes, or a 4 gigabyte (4 GB) range). In 64-bit architecture systems, the number of address lines is 64, allowing for a significantly larger amount of addressable memory, theoretically up to $2^{64}$ (e.g., 18.4 exabytes). SSDs use a technique called logical block addressing (LBA) to access specific data. A host accesses an SSD through an LBA. Each LBA represents a sector, which may be 512 bytes in size. A cluster or block is assigned a unique LBA number, which acts as its address. SSDs store data in pages, which are combined to form blocks. The smallest addressable unit on a disk storage is a block, which is usually 512 bytes in size. An operating system can address and access any external storage, like SSD, at the individual byte level. However, the actual reading and writing data at the hardware level regularly happens in blocks.

FIG. 1 illustrates an example system 100 in accordance with one or more implementations as described herein. In FIG. 1, machine 105, which may be termed a host, a system, or a server, is shown. While FIG. 1 depicts machine 105 as a tower computer, embodiments of the disclosure may extend to any form factor or type of machine. For example, machine 105 may be a rack server, a blade server, a desktop computer, a tower computer, a mini tower computer, a desktop server, a laptop computer, a notebook computer, a tablet computer, etc.

Machine 105 may include processor 110, memory 115, and storage device 120. Processor 110 may be any variety of processor. It is noted that processor 110, along with the other components discussed below, are shown outside the machine for case of illustration: embodiments of the disclosure may include these components within the machine. While FIG. 1 shows a single processor 110, machine 105 may include any number of processors, each of which may be single core or multi-core processors, each of which may implement a Reduced Instruction Set Computer (RISC) architecture or a Complex Instruction Set Computer (CISC) architecture (among other possibilities), and may be mixed in any desired combination.

Processor 110 may be coupled to memory 115. Memory 115 may be any variety of memory, such as flash memory, Dynamic Random Access Memory (DRAM), Static Random Access Memory (SRAM), Persistent Random Access Memory, Ferroelectric Random Access Memory (FRAM), or Non-Volatile Random Access Memory (NVRAM), such as Magnetoresistive Random Access Memory (MRAM), Phase Change Memory (PCM), or Resistive Random-Access Memory (ReRAM). Memory 115 may include volatile and/or non-volatile memory. Memory 115 may use any desired form factor: for example, Single In-Line Memory Module (SIMM), Dual In-Line Memory Module (DIMM), Non-Volatile DIMM (NVDIMM), etc. Memory 115 may be any desired combination of different memory types, and may be managed by memory controller 125. Memory 115 may be used to store data that may be termed "short-term": that is, data not expected to be stored for extended periods of time. Examples of short-term data may include temporary files, data being used locally by applications (which may have been copied from other storage locations), and the like.

Processor 110 and memory 115 may support an operating system under which various applications may be running. These applications may issue requests (which may be termed commands) to read data from or write data to either memory 115 or storage device 120. When storage device 120 is used to support applications reading or writing data via some sort of file system, storage device 120 may be accessed using device driver 130. While FIG. 1 shows one storage device 120, there may be any number (one or more) of storage devices in machine 105. Storage device 120 may support any desired protocol or protocols, including, for example, the Non-Volatile Memory Express (NVMe) protocol, a Serial Attached Small Computer System Interface (SCSI) (SAS) protocol, or a Serial AT Attachment (SATA) protocol. Storage device 120 may include any desired interface, including, for example, a Peripheral Component Interconnect Express (PCIe) interface, or a Compute Express Link (CXL) interface. Storage device 120 may take any desired form factor, including, for example, a U.2 form factor, a U.3 form factor, a M.2 form factor, Enterprise and Data Center Standard Form Factor (EDSFF) (including all of its varieties, such as E1 short, E1 long, and the E3 varieties), or an Add-In Card (AIC).

While FIG. 1 uses the term "storage device," embodiments of the disclosure may include any storage device formats that may benefit from the use of computational storage units, examples of which may include hard disk drives, Solid State Drives (SSDs), or persistent memory devices, such as PCM, ReRAM, or MRAM. Any reference to "storage device" "SSD" below should be understood to include such other embodiments of the disclosure and other varieties of storage devices. In some cases, the term "storage unit" may encompass storage device 120 and memory 115. Machine 105 may include power supply 135. Power supply 135 may provide power to machine 105 and its components.

Machine 105 may include transmitter 145 and receiver 150. Transmitter 145 or receiver 150 may be respectively used to transmit or receive data. In some cases, transmitter 145 and/or receiver 150 may be used to communicate with memory 115 and/or storage device 120. Transmitter 145 may include write circuit 160, which may be used to write data into storage, such as a register, in memory 115 and/or storage device 120. In a similar manner, receiver 150 may include read circuit 165, which may be used to read data from storage, such as a register, in memory 115 and/or storage device 120. In some examples, write circuit 160 may write compressed data to storage (e.g., storage device 120) and/or read circuit 165 may read compressed data from storage (e.g., storage device 120). In some cases, write circuit 160 may compress data and write the compressed data to storage and/or read circuit 165 may read the compressed data from storage, decompress the compressed data, and provide the decompressed data to a component of machine 105 (e.g., to processor 110, memory controller 125, memory 115) and/or to a device external to machine 105.

In one or more examples, machine 105 may be implemented with any type of apparatus. Machine 105 may be configured as (e.g., as a host of) one or more of a server such as a compute server, a storage server, storage node, a network server, a supercomputer, data center system, and/or the like, or any combination thereof. Additionally, or alternatively, machine 105 may be configured as (e.g., as a host of) one or more of a computer such as a workstation, a personal computer, a tablet, a smartphone, and/or the like, or any combination thereof. Machine 105 may be implemented with any type of apparatus that may be configured as a device including, for example, an accelerator device, a storage device, a network device, a memory expansion and/or buffer device, a central processing unit (CPU), a graphics processing unit (GPU), a neural processing unit (NPU), a tensor processing unit (TPU), and/or the like, or any combination thereof.

Any communication between devices including machine 105 (e.g., host, computational storage device, and/or any intermediary device) can occur over an interface that may be implemented with any type of wired and/or wireless communication medium, interface, protocol, and/or the like including PCIe, NVMe, Ethernet, NVMe-OF, Compute Express Link (CXL), and/or a coherent protocol such as CXL.mem, CXL.cache, CXL.IO and/or the like, Gen-Z, Open Coherent Accelerator Processor Interface (Open-CAPI), Cache Coherent Interconnect for Accelerators (CCIX), Advanced extensible Interface (AXI) and/or the like, or any combination thereof, Transmission Control Protocol/Internet Protocol (TCP/IP), FibreChannel, Infini-Band, Serial AT Attachment (SATA), Small Computer Systems Interface (SCSI), Serial Attached SCSI (SAS), iWARP, any generation of wireless network including 2G, 3G, 4G, 5G, and/or the like, any generation of Wi-Fi, Bluetooth, near-field communication (NFC), and/or the like, or any combination thereof. In some embodiments, the communication interfaces may include a communication fabric including one or more links, buses, switches, hubs, nodes, routers, translators, repeaters, and/or the like. In some embodiments, system 100 may include one or more additional apparatus having one or more additional communication interfaces.

Any of the functionality described herein, including any of the host functionality, device functionally, compression controller 140 functionality, and/or the like, may be implemented with hardware, software, firmware, or any combination thereof including, for example, hardware and/or software combinational logic, sequential logic, timers, counters, registers, state machines, volatile memories such as dynamic random access memory (DRAM) and/or static random access memory (SRAM), nonvolatile memory including flash memory, persistent memory such as cross-gridded nonvolatile memory, memory with bulk resistance change, phase change memory (PCM), and/or the like and/or any combination thereof, complex programmable logic devices (CPLDs), field programmable gate arrays (FPGAs), application specific integrated circuits (ASICs) CPUs including complex instruction set computer (CISC) processors such as x86 processors and/or reduced instruction set computer (RISC) processors such as RISC-V and/or ARM processors), graphics processing units (GPUs), neural processing units (NPUs), tensor processing units (TPUs) and/or the like, executing instructions stored in any type of memory. In some embodiments, one or more components may be implemented as a system-on-chip (SOC).

In some examples, compression controller 140 may include any one or combination of logic (e.g., logical circuit), hardware (e.g., processing unit, memory, storage), software, firmware, and the like. In some cases, compression controller 140 may perform one or more functions in conjunction with processor 110. In some cases, at least a portion of compression controller 140 may be implemented in or by processor 110 and/or memory 115. The one or more logic circuits of compression controller 140 may include any one or combination of multiplexers, registers, logic gates, arithmetic logic units (ALUs), cache, computer memory, microprocessors, processing units (CPUs, GPUs, NPUs, and/or TPUs), FPGAs, ASICs, etc., that enable compression controller 140 to provide compression for artificial intelligence models.

In one or more examples, compression controller 140 may include one or more compression units, one or more decompression units, one or more endecs, one or more codecs, etc. In some cases, compression controller 140 may categorize data (e.g., data of an AI model) based on an analysis of a distribution of the data in a histogram, compress the data using a compression algorithm that is selected based on the categorization, and generate address boundary information based on the selected compression algorithm. In some examples, compression controller 140 may identify a memory address of data based on a request for the data, determine a decompression algorithm based on the memory address, and decompress the data using the determined decompression algorithm.

In one or more examples, compression controller 140 provides a higher lossless compression ratio compared to some approaches. Also, the compression logic and methodology can be applied to a portion of an AI model or can be applied to all of an AI model. The compression achieved by compression controller 140 is significantly higher than the compression of other approaches (e.g., greater than 22% compression ratio compared to 10% or less compression ratios of other approaches). Accordingly, compression controller 140 increases compression rates, increases system efficiency, increases AI inference performance, and increases AI training performance, all while lowering associated costs.

Figure 2:
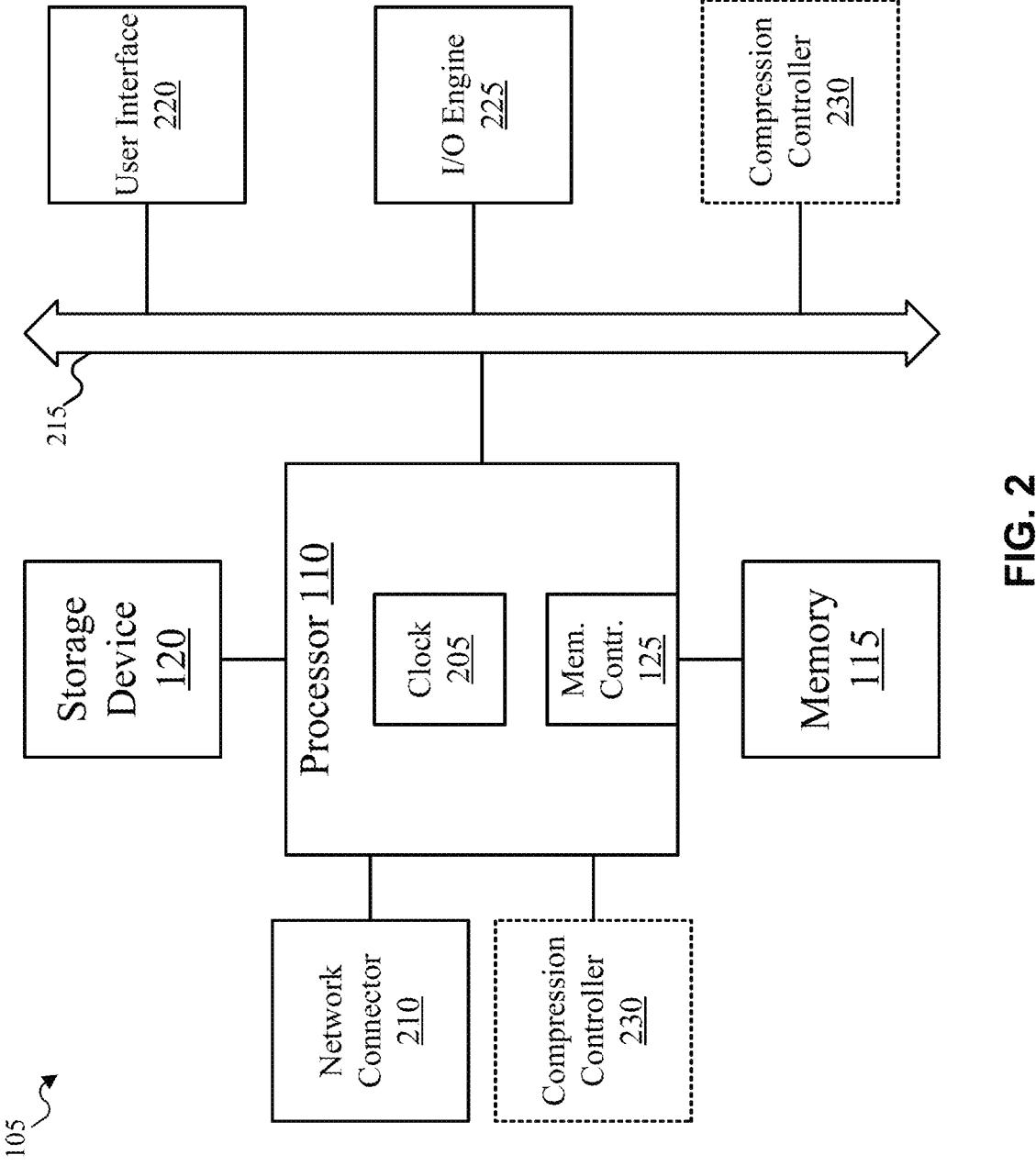
FIG. 2 illustrates details of the system of FIG. 1, according to one or more implementations as described herein.

FIG. 2 illustrates details of machine 105 of FIG. 1, according to examples described herein. In FIG. 2, typically, machine 105 includes one or more processors 110, which may include memory controllers 125 and clocks 205, which may be used to coordinate the operations of the components of the machine. Processors 110 may be coupled to memories 115, which may include random access memory (RAM), read-only memory (ROM), or other state preserving media, as examples. Processors 110 may be coupled to storage devices 120, and to network connector 210, which may be, for example, an Ethernet connector or a wireless connector. Processors 110 may be connected to buses 215, to which may be attached user interfaces 220 and Input/Output (I/O) interface ports that may be managed using I/O engines 225, among other components. As shown, processors 110 may be coupled to compression controller 230, which may be an example of compression controller 140 of FIG. 1. Additionally, or alternatively, processors 110 may be connected to buses 215, to which may be attached compression controller 230.

FIG. 3 illustrates an example system 300 in accordance with one or more implementations as described herein. As shown, system 300 includes memory 305, compression unit 310 (e.g., compression/decompression unit, one or more endecs, one or more codecs), processing unit 315 (e.g., CPU, GPU, NPU), and communication interface 320. Memory 305 may include memory (e.g., RAM, SRAM, DRAM, memory 115 of FIG. 1 and/or FIG. 2) and/or storage (e.g., flash memory, SSD, storage device 120 of FIG. 1 and/or FIG. 2). Compression unit 310 may be an example of compression controller 140 of FIG. 1 and/or compression controller 230 of FIG. 2. Processing unit 315 may be an example of processor 110 of FIG. 1 and/or FIG. 2. Communication interface 320 may be an example of a communication interface of machine 105 (e.g., connecting one or more components of machine 105) and/or of buses 215 of FIG. 2.

In one or more examples, system 300 illustrates an example data compression system. In some examples, compression unit 310 may be configured to compress and/or decompress data communicated between memory 305 and processing unit 315. In some examples, when processing unit 315 sends data to memory 305, compression unit 310 compresses the data. Additionally, or alternatively, when processing unit 315 retrieves data from memory 305, compression unit 310 decompresses the data.

The data size associated with an AI model may be reduced by compressing at least a portion of the AI model (e.g., the AI model weights, etc.). However, challenges exist with regards to compression of AI models. For example, compression of AI model weights may have less redundancy, thus reducing the effectiveness of compression. Also, some approaches to compression are relatively inefficient (e.g., around 10% compression ratio).

Using lossy compression can affect (e.g., positively affect) AI inference performance and/or AI training performance. However, as the data size of AI models can be relatively large, memory 305 bandwidth can affect AI operation (e.g., detrimentally affect latency, efficiency, computational costs, etc., of AI operation). High bandwidth memory (HBM) may be used, but HBM is expensive compared to other types of memory, such as double data rate (DDR) memory, graphics DDR memory, etc. Also, in some cases, using lossless compression for AI models may be impractical because the compression ratios of some lossless compression systems may be too low (e.g., offer minimal improvement to latency, efficiency, computational costs, etc., based on cost-benefit analysis).

Figure 4:
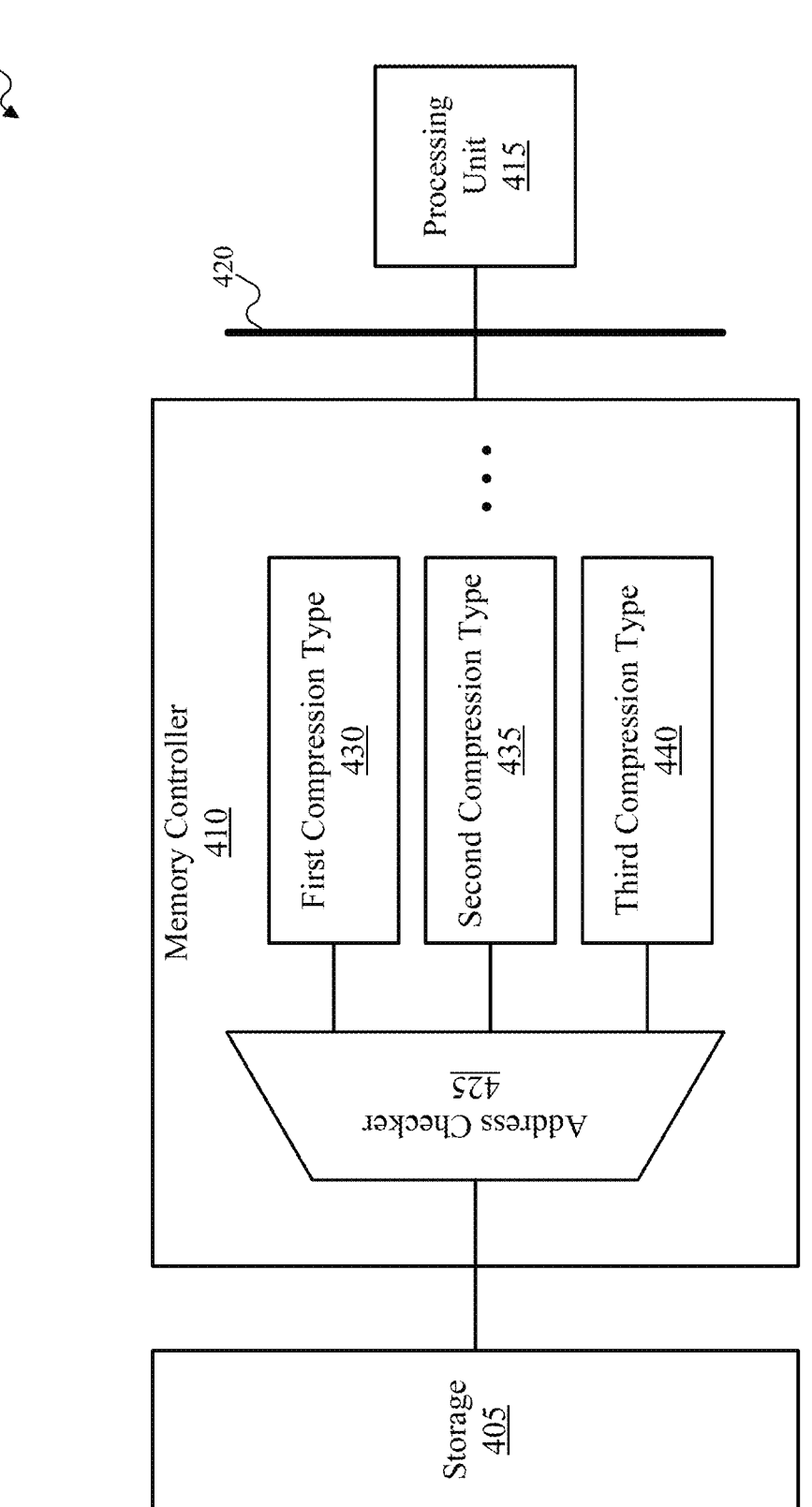
FIG. 4 illustrates an example system in accordance with one or more implementations as described herein.

FIG. 4 illustrates an example system 400 in accordance with one or more implementations as described herein. System 400 illustrates an example system of a compression methodology for artificial intelligence models. In some examples, system 400 may be used for a compression operation and/or a decompression operation. In the illustrated example, system 400 includes storage 405, memory controller 410, processing unit 415, and communication interface 420. As shown, memory controller 410 includes address checker 425 and one or more compression types, such as first compression type 430, second compression type 435, third compression type 440 (e.g., multiple endecs of various compression types, codecs, etc.).

In one or more examples, storage 405 may include memory (e.g., SRAM, DRAM, memory 115 of FIG. 1 and/or FIG. 2) and/or storage (e.g., SSD, storage device 120 of FIG. 1 and/or FIG. 2). Memory controller 410 may be an example of memory controller 125 of FIG. 1 and/or FIG. 2. In some cases, memory controller 410 may be part of and/or operate in conjunction with compression controller 140 of FIG. 1, compression controller 230 of FIG. 2, and/or compression unit 310 of FIG. 3. In some implementations, processing unit 415 may be an example of processor 110 of FIG. 1, processor 110 of FIG. 2, and/or processing unit 315 of FIG. 3. Communication interface 420 may be an example of a communication interface of machine 105 (e.g., connecting one or more components of machine 105), of buses 215 of FIG. 2, and/or communication interface 320 of FIG. 3. In some cases, one or more components of system 400 may be interconnected and/or communicate via communication interface 420. In some examples, address checker 425 may be part of and/or operate in conjunction with compression controller 140 of FIG. 1, compression controller 230 of FIG. 2, and/or compression unit 310 of FIG. 3. In some cases, address checker 425 may include a multiplexor (e.g., mux). In some examples, processor 110 of FIG. 1, processor 110 of FIG. 2, and/or processing unit 315 of FIG. 3 may include at least a portion of address checker 425 and/or operate in conjunction with address checker 425.

In the illustrated example, address checker 425 is connected (e.g., communicatively connected) to storage 405, first compression type 430, second compression type 435, and third compression type 440. In one or more examples, storage 405 may store compressed data (e.g., compressed weights of at least one AI model). When the compressed data in storage 405 is accessed (e.g., retrieved for use by a processing unit, etc.), the compressed data is decompressed. In one or more examples, the compressed data may be stored at a memory address of storage 405. In some cases, address checker 425 determines which compression was used to compress the compressed data by comparing the memory address of the compressed data to a boundary address (e.g., address boundary information for the compression algorithm, the boundary address associated with the AI model). In some cases, at least a first boundary address may be associated with first compression type 430, at least a second boundary address may be associated with second compression type 435, at least a third boundary address may be associated with third compression type 440, and so on. In some cases, a first set of one or more boundary addresses may be associated with first compression type 430, a second set of one or more boundary addresses may be associated with second compression type 435, a third set of one or more boundary addresses may be associated with third compression type 440, and so on.

In some examples, upon address checker 425 determining which compression was used to compress the compressed data based on the comparing, address checker 425 may transfer the compressed data from storage 405 to a corresponding endec (e.g., a decompression module of first compression type 430, second compression type 435, or third compression type 440, etc.). After decompression, the memory controller 410 may forward the decompressed data to processing unit 415 (e.g., based on processing unit 415 accessing the data, requesting the data, for AI processing). Additionally, or alternatively, upon address checker 425 determining which compression was used to compress the compressed data based on the comparing, address checker 425 may implement a decompression algorithm that corresponds to the boundary address. For example, when the comparing indicates that the address boundary is associated with third compression type 440, address checker 425 may implement a decompression algorithm that corresponds to third compression type 440 to decompress the compressed data. Memory controller 410 may then forward the decompressed data to processing unit 415.

In one or more examples, compression controller 140 may perform one or more operations in conjunction with memory controller 410. For example, compression controller 140 may generate a histogram based on data (e.g., data associated with an AI model). In some cases, compression controller 140 may generate a histogram based on the weights of an AI model. In some cases, compression controller 140 may categorize the data based on compression controller 140, analyzing the distribution of the data in the histogram. Based on the analysis, compression controller 140 may select a compression algorithm that corresponds to the distribution of the data in the histogram. In some cases, compression controller 140 may use the selected compression algorithm to compress the data (e.g., compress the weights of the AI model, compress the entire AI model including the weights, etc.) to generate compressed data and store the compressed data in a storage device (e.g., SSD, flash memory, etc.).

In one or more examples, compression controller 140 may generate address boundary information based on the compression algorithm that compression controller 140 selects according to the analysis of the histogram. In some cases, compression controller 140 may store a mapping between the address boundary information and the compression algorithm (e.g., stored in the storage device, in memory, etc.). In some examples, the address boundary information is based on an address where the compressed data is stored in the storage device. For example, the address boundary information may include a boundary address that is based on an address where the compressed data is stored in the storage device.

In one or more examples, compression controller 140 may identify an address associated with compressed data based on a request for the compressed data, determine a decompression algorithm based on the address, and decompress the compressed data using the determined decompression algorithm. In some cases, compression controller 140 may identify the decompression algorithm based on compression controller 140 comparing the address of the compressed data to a boundary address associated with the decompression algorithm (e.g., a boundary address corresponding to the decompression algorithm) and identify a match between the boundary address and the decompression algorithm based on the comparing. In some examples, the storage device stores a mapping between the boundary address and the decompression algorithm.

FIG. 5 depicts a flow diagram illustrating an example method 500 associated with the disclosed systems, in accordance with example implementations described herein. In some configurations, the method 500 may be implemented by compression controller 140 of FIG. 1, compression controller 230 of FIG. 2, and/or compression controller 340 of FIG. 3. In some configurations, the method 500 may be implemented in conjunction with machine 105, components of machine 105, or any combination thereof. The method 500 is just one implementation and one or more operations of the method 500 may be rearranged, reordered, omitted, and/or otherwise modified such that other implementations are possible and contemplated.

At 505, the method 500 may include categorizing data based on an analysis of a distribution of the data in a histogram. For example, compression controller 140 may generate a histogram based on a set of data (e.g., a set of weights of an AI model) and categorize the data based on an analysis of the distribution of the data in the histogram.

At 510, the method 500 may include compressing the data to generate compressed data based on a compression algorithm that is selected according to the categorization. For example, compression controller 140 may select a compression algorithm that corresponds to the distribution of the data in the histogram and use the selected algorithm to compress the data to generate compressed data.

At 515, the method 500 may include storing the compressed data in a storage device. For example, compression controller 140 may store the compressed data in a solid-state drive.

FIG. 6 depicts a flow diagram illustrating an example method 600 associated with the disclosed systems, in accordance with example implementations described herein. In some configurations, the method 600 may be implemented by compression controller 140 of FIG. 1, compression controller 230 of FIG. 2, and/or compression controller 340 of FIG. 3. In some configurations, the method 600 may be implemented in conjunction with machine 105, components of machine 105, or any combination thereof. The method 600 is just one implementation and one or more operations of the method 600 may be rearranged, reordered, omitted, and/or otherwise modified such that other implementations are possible and contemplated.

At 605, the method 600 may include identifying an address associated with compressed data based on a request for the compressed data. For example, based on a request for the compressed data (e.g., by a host, by a processing unit, etc.), compression controller 140 may identify an address associated with where the compressed data is stored in the storage device.

At 610, the method 600 may include determining a decompression algorithm based on the address. For example, compression controller 140 may determine a decompression algorithm that corresponds to a boundary address associated with where the compressed data is stored in the storage device.

At 615, the method 600 may include decompressing the compressed data using the determined decompression algorithm. For example, compression controller 140 may identify a decompression algorithm that corresponds to the boundary address and use the decompression algorithm to decompress the compressed data. In some cases, compression controller 140 may provide the decompressed data to a device or component that requested it (e.g., to a host, to a processing unit, etc.).

FIG. 7 depicts a flow diagram illustrating an example method 700 associated with the disclosed systems, in accordance with example implementations described herein. In some configurations, the method 700 may be implemented by compression controller 140 of FIG. 1, compression controller 230 of FIG. 2, and/or compression controller 340 of FIG. 3. In some configurations, the method 700 may be implemented in conjunction with machine 105, components of machine 105, or any combination thereof. The method 700 is just one implementation and one or more operations of the method 700 may be rearranged, reordered, omitted, and/or otherwise modified such that other implementations are possible and contemplated.

At 705, the method 700 may include categorizing data based on an analysis of a distribution of the data in a histogram. For example, compression controller 140 may generate a histogram based on a set of data (e.g., a set of weights of an AI model) and categorize the data based on an analysis of the distribution of the data in the histogram.

At 710, the method 700 may include compressing the data to generate compressed data based on a compression algorithm that is selected according to the categorization. For example, compression controller 140 may select a compression algorithm that corresponds to the distribution of the data in the histogram and use the selected algorithm to compress the data to generate compressed data.

At 715, the method 700 may include storing the compressed data in a storage device. For example, compression controller 140 may store the compressed data in a solid-state drive.

At 720, the method 700 may include generating address boundary information based on the compression algorithm that is selected and an address where the compressed data is stored in the storage device. For example, compression controller 140 may generate address boundary information (e.g., a boundary address) based on the compression algorithm that is selected (e.g., according to the analysis of the distribution of the data in the histogram). Additionally, or alternatively, compression controller 140 may generate the address boundary information based on an address where the compressed data is stored in the storage device.

Figure 8:
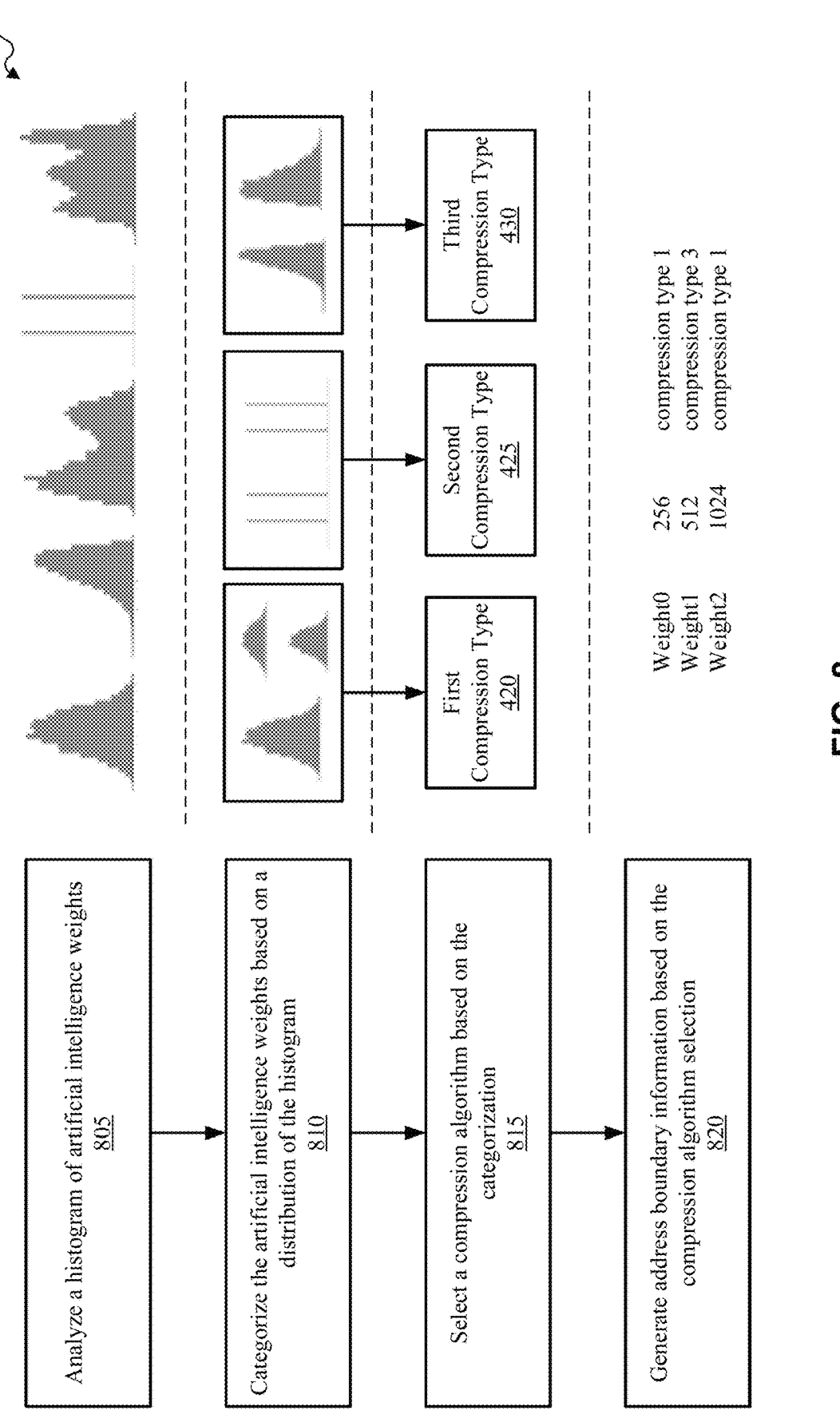
FIG. 8 depicts a flow diagram illustrating an example method associated with the disclosed systems, in accordance with example implementations described herein.

FIG. 8 depicts a flow diagram illustrating an example method 800 associated with the disclosed systems, in accordance with example implementations described herein. FIG. 8 depicts a model analysis process for a compression methodology of artificial intelligence models. In some configurations, the method 800 may be implemented by compression controller 140 of FIG. 1, compression controller 230 of FIG. 2, and/or compression controller 340 of FIG. 3. In some configurations, the method 800 may be implemented in conjunction with machine 105, components of machine 105, or any combination thereof. The method 800 is just one implementation and one or more operations of the method 800 may be rearranged, reordered, omitted, and/or otherwise modified such that other implementations are possible and contemplated.

At 805, the method 800 may include analyzing a histogram of artificial intelligence weights. For example, compression controller 140 may analyze data of a histogram associated with artificial intelligence weights. For instance, before applying a compression algorithm, compression controller 140 may analyze an AI model by calculating a histogram (e.g., a histogram of AI weights). In some cases, compression controller 140 analyzes at least a portion of the weights of an AI model. Additionally, or alternatively, compression controller 140 analyzes all the weights of the AI model. Multiple example histograms are depicted at the analysis stage of method 800. In some cases, compression controller 140 may compare the histogram to a list of possible histogram types. The list of possible histogram types may include at least one of symmetric distribution (e.g., bell curve, unimodal), multimodal distribution, bimodal distribution, symmetric bimodal distribution, non-symmetric bimodal distribution, skew right distribution, skew left distribution, skewed distribution (e.g., skew right and/or skew left), spiked distribution, uniform distribution (e.g., flat distribution, box distribution), and random distribution. In the non-limiting example, the categorize stage shows a bell curve distribution category (e.g., first compression type 430), a spiked distribution category (e.g., second compression type 435), and a skewed distribution category (e.g., third compression type 430).

At 810, the method 800 may include categorizing the artificial intelligence weights based on a distribution of the histogram. For example, compression controller 140 may categorize the artificial intelligence weights based on the distribution of the histogram. Thus, based on the results of the histogram analysis, the weights are classified according to histogram type. As a result, weights of various histograms may be placed in the same category based on having similar histograms.

At 815, the method 800 may include selecting a compression algorithm based on the categorization. For example, compression controller 140 may select a compression algorithm (e.g., first compression type 430, second compression type 435, or third compression type 440) based on the categorization. In some cases, compression controller 140 may compress data using the selected compression algorithm. For example, after completing classification of the weights of an AI model, a compression algorithm is determined and selected for the weights based on the categorized results. The compression algorithm is applied to the weights (e.g., the weights are compressed based on first compression type 430, second compression type 435, or third compression type 440, etc.).

At 820, the method 800 may include generating address boundary information based on the compression algorithm selection. For example, compression controller 140 may generate address boundary information based on the compression algorithm selection. For instance, address boundary information for the selected compression algorithm is then generated. When compressing an AI model (e.g., the weights of the AI model), the storage address (e.g., an address where the compressed data is stored in an SSD) is checked in relation to the selected compression algorithm. After compressing the AI model (e.g., the weights of the AI model), the compressed AI model is stored in storage (e.g., in a SSD) and a boundary address is determined based on the storage address or storage address range where the compressed data is stored in the storage device. A mapping of the selected compression algorithm and the boundary address is generated and stored to maintain the connection between the compression algorithm used to compress the compressed data and the location where the compressed data is stored in the storage device.

In some examples, an address range may be associated with a storage location of the compressed data, where each range of memory includes a boundary address. Thus, based on the mapping, a compression algorithm may be mapped to the boundary address to identify what compression algorithm was used to compress the compressed data. For example, a first address range may be associated with a first compression algorithm, a second address range may be associated with a second compression algorithm, a third address range may be associated with a third compression algorithm, and so forth. In some cases, a given compression algorithm may be associated with multiple memory ranges. For example, continuing with the example of the first, second and third address ranges, a fourth address range may be associated with the first compression algorithm, a fifth address range may be associated with a fourth compression algorithm, a sixth address range may be associated with the third compression algorithm, and so on.

In the illustrated example, address boundary information is generated for weight0, weight1, and weight2. Weight0 may include a set of weights of a first histogram (e.g., weights of a first AI model), weight1 may include set of weights of a second histogram (e.g., weights of a second AI model), and weight2 may include set of weights of a third histogram (e.g., weights of a third AI model). As shown, weight0 is associated with a boundary address of 256 (e.g., an address range from 0 to 255), and boundary address 256 is mapped to compression type 1 (e.g., a first type of compression algorithm). Weight1 is associated with a boundary address of 512 (e.g., an address range from 256 to 511), and boundary address 512 is mapped to compression type 3. Weight2 is associated with a boundary address of 1024 (e.g., an address range from 512 to 1023), and boundary address 1024 is mapped to compression type 1. Thus, a compression type may be mapped two or more address ranges. For example, a compression type may be mapped to a noncontiguous range of memory such as compression type 1 mapped to boundary address 256 (address range 0 to 255) and mapped to boundary address 1024 (address range 512 to 1023) and/or a compression type may be mapped to a contiguous range of memory such as compression type 1 mapped to boundary address 256 (address range 0 to 255) and compression type 1 mapped to boundary address 512 (address range 256 to 511), and so on. It is noted that the address ranges used here are example ranges. In some cases, the address ranges may be based on the size of the AI model (e.g., the size of the compressed AI model). The larger the AI model the larger the address range.

In some examples, compression controller 140 stores a log that maps boundary address information with compression types. For example, compression controller 140 stores a log that maps weight0 to boundary address 256 and compression type 1, maps weight1 to boundary address 512 and compression type 3, and maps weight1 to boundary address 1024 and compression type 1. In some cases, the log is stored in storage (e.g., storage device 120, memory 305, storage 405, etc.) and/or memory (e.g., memory 115, memory 305, storage 405, etc.). In some cases, mapping a boundary address to a compression algorithm includes mapping the boundary address to a decompression algorithm.

In the examples described herein, the configurations and operations are example configurations and operations, and may involve various additional configurations and operations not explicitly illustrated. In some examples, one or more aspects of the illustrated configurations and/or operations may be omitted. In some embodiments, one or more of the operations may be performed by components other than those illustrated herein. Additionally, or alternatively, the sequential and/or temporal order of the operations may be varied.

Certain embodiments may be implemented in one or a combination of hardware, firmware, and software. Other embodiments may be implemented as instructions stored on a computer-readable storage device, which may be read and executed by at least one processor to perform the operations described herein. A computer-readable storage device may include any non-transitory memory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media.

The word "exemplary" is used herein to mean "serving as an example, instance, or illustration." Any embodiment described herein as "exemplary" is not necessarily to be construed as preferred or advantageous over other embodiments. The terms "computing device," "user device," "communication station," "station," "handheld device," "mobile device," "wireless device" and "user equipment" (UE) as used herein refers to a wireless communication device such as a cellular telephone, smartphone, tablet, netbook, wireless terminal, laptop computer, a femtocell, High Data Rate (HDR) subscriber station, access point, printer, point of sale device, access terminal, or other personal communication system (PCS) device. The device may be either mobile or stationary.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as 'communicating', when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

Some embodiments may be used in conjunction with various devices and systems, for example, a Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some embodiments may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some embodiments may be used in conjunction with one or more types of wireless communication signals and/or systems following one or more wireless communication protocols, for example, Radio Frequency (RF), Infrared (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth™, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other embodiments may be used in various other devices, systems, and/or networks.

Although an example processing system has been described above, embodiments of the subject matter and the functional operations described herein can be implemented in other types of digital electronic circuitry, or in computer software, firmware, or hardware, including the structures disclosed in this specification and their structural equivalents, or in combinations of one or more of them.

Embodiments of the subject matter and the operations described herein can be implemented in digital electronic circuitry, or in computer software, firmware, or hardware, including the structures disclosed in this specification and their structural equivalents, or in combinations of one or more of them. Embodiments of the subject matter described herein can be implemented as one or more computer programs, i.e., one or more components of computer program instructions, encoded on computer storage medium for execution by, or to control the operation of, information/data processing apparatus. Alternatively, or in addition, the program instructions can be encoded on an artificially-generated propagated signal, for example a machine-generated electrical, optical, or electromagnetic signal, which is generated to encode information/data for transmission to suitable receiver apparatus for execution by an information/data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (for example multiple CDs, disks, or other storage devices).

The operations described herein can be implemented as operations performed by an information/data processing apparatus on information/data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, for example an FPGA (field programmable gate array) or an ASIC (application-specific integrated circuit). The apparatus can also include, in addition to hardware, code that creates an execution environment for the computer program in question, for example code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a standalone program or as a component, component, subroutine, object, or other unit suitable for use in a computing environment. A computer program may, but need not, correspond to a file in a file system. A program can be stored in a portion of a file that holds other programs or information/data (for example one or more scripts stored in a markup language document), in a single file dedicated to the program in question, or in multiple coordinated files (for example files that store one or more components, sub-programs, or portions of code). A computer program can be deployed to be executed on one computer or on multiple computers that are located at one site or distributed across multiple sites and interconnected by a communication network.

The processes and logic flows described herein can be performed by one or more programmable processors executing one or more computer programs to perform actions by operating on input information/data and generating output. Processors suitable for the execution of a computer program include, by way of example, both general and special purpose microprocessors, and any one or more processors of any kind of digital computer. Generally, a processor will receive instructions and information/data from a read-only memory or a random access memory or both. The essential elements of a computer are a processor for performing actions in accordance with instructions and one or more memory devices for storing instructions and data. Generally, a computer will also include, or be operatively coupled to receive information/data from or transfer information/data to, or both, one or more mass storage devices for storing data, for example magnetic, magneto-optical disks, or optical disks. However, a computer need not have such devices. Devices suitable for storing computer program instructions and information/data include all forms of non-volatile memory, media and memory devices, including by way of example semiconductor memory devices, for example EPROM, EEPROM, and flash memory devices; magnetic disks, for example internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described herein can be implemented on a computer having a display device, for example a CRT (cathode ray tube) or LCD (liquid crystal display) monitor, for displaying information/data to the user and a keyboard and a pointing device, for example a mouse or a trackball, by which the user can provide input to the computer. Other kinds of devices can be used to provide for interaction with a user as well; for example, feedback provided to the user can be any form of sensory feedback, for example visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described herein can be implemented in a computing system that includes a back-end component, for example as an information/data server, or that includes a middleware component, for example an application server, or that includes a front-end component, for example a client computer having a graphical user interface or a web browser through which a user can interact with an embodiment of the subject matter described herein, or any combination of one or more such back-end, middleware, or front-end components. The components of the system can be interconnected by any form or medium of digital information/data communication, for example a communication network. Examples of communication networks include a local area network ("LAN") and a wide area network ("WAN"), an inter-network (for example the Internet), and peer-to-peer networks (for example ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits information/data (for example an HTML page) to a client device (for example for purposes of displaying information/data to and receiving user input from a user interacting with the client device). Information/data generated at the client device (for example a result of the user interaction) can be received from the client device at the server.

While this specification contains many specific embodiment details, these should not be construed as limitations on the scope of any embodiment or of what may be claimed, but rather as descriptions of features specific to particular embodiments. Certain features that are described herein in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain embodiments, multitasking and parallel processing may be advantageous.

Many modifications and other examples described herein set forth herein will come to mind to one skilled in the art to which these embodiments pertain having the benefit of the teachings presented in the foregoing descriptions and the associated drawings. Therefore, it is to be understood that the embodiments are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed:

1. A method comprising:
categorizing data based on an analysis of a distribution of the data in a histogram, wherein the data includes weights of an artificial intelligence model;
generating compressed data based on the data and on a compression algorithm that is selected based on the categorization; and
storing the compressed data in a storage device.

2. The method of claim 1, further comprising generating address boundary information based on the compression algorithm that is selected.

3. The method of claim 2, further comprising storing a mapping between the address boundary information and the compression algorithm.

4. The method of claim 2, wherein the address boundary information is based on an address where the compressed data is stored in the storage device.

5. The method of claim 1, further comprising generating a histogram based on the data.

6. The method of claim 1, wherein the data includes weights of an artificial intelligence model, and further comprising generating a histogram based on the weights of the artificial intelligence model.

7. The method of claim 6, wherein the distribution of the data is based on the histogram.

8. The method of claim 1, wherein:
the storage device includes a solid-state drive, and
at least a portion of the compression is performed by a processing unit communicatively connected to the storage device.

9. A method comprising:

identifying an address associated with compressed data based on a request for the compressed data;

determining a decompression algorithm based on the address, wherein the address is associated with an address range of where the compressed data is stored in a storage device; and decompressing the compressed data using the determined decompression algorithm.

10. The method of claim 9, wherein identifying the decompression algorithm is based on comparing the address of the compressed data to a boundary address associated with the decompression algorithm and identifying a match based on the comparing.

11. The method of claim 9, wherein the compressed data includes weights of an artificial intelligence model.

12. The method of claim 9, wherein:

the storage device includes a solid-state drive, and at least a portion of the compression is performed by a processing unit communicatively connected to the storage device.

13. The method of claim 9, wherein the storage device includes a mapping between a boundary address and the decompression algorithm.

14. A device, comprising:

at least one processing unit to:

identify an address associated with compressed data based on a request for the compressed data; and determine a decompression algorithm based on the address, wherein the address is associated with an address range of where the compressed data is stored in a storage device; and a decompressor to decompress the compressed data using the determined decompression algorithm.

15. The device of claim 14, wherein:

the decompression algorithm corresponds to a distribution of data that includes weights of an artificial intelligence model, and the compressed data includes the weights of the artificial intelligence model.

16. The device of claim 14, wherein, to identify the decompression algorithm, the at least one processing unit is configured to:

compare the address of the compressed data to a boundary address associated with the decompression algorithm; and identify a match based on the comparison.

17. The device of claim 14, wherein the storage device stores a mapping between a boundary address and the decompression algorithm.

18. The device of claim 14, wherein the storage device includes a solid-state drive.

* * * * *